US012237286B2

(12) United States Patent
Agarwal (10) Patent No.: US 12,237,286 B2
(45) Date of Patent: Feb. 25, 2025

(54) HIGH-SPEED DIE CONNECTIONS USING A CONDUCTIVE INSERT

(71) Applicant: ADVANCED MICRO DEVICES, INC., Santa Clara, CA (US)

(72) Inventor: Rahul Agarwal, Livermore, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 18/455,960

(22) Filed: Aug. 25, 2023

(65) Prior Publication Data

US 2023/0411331 A1 Dec. 21, 2023

Related U.S. Application Data

(63) Continuation of application No. 17/118,126, filed on Dec. 10, 2020, now Pat. No. 11,749,629.

(51) Int. Cl.
*H01L 23/00* (2006.01)
*H01L 23/528* (2006.01)

(52) U.S. Cl.
CPC .......... *H01L 24/13* (2013.01); *H01L 23/5283* (2013.01); *H01L 24/05* (2013.01); *H01L 24/81* (2013.01); *H01L 2224/02331* (2013.01)

(58) Field of Classification Search
CPC ..... H01L 24/13; H01L 23/5283; H01L 24/05; H01L 24/81; H01L 2224/02331
See application file for complete search history.

(56) References Cited

U.S. PATENT DOCUMENTS

| | | | |
|---|---|---|---|
| 8,659,144 B1 * | 2/2014 | Sutardja | H01L 23/49827 257/E23.079 |
| 10,924,269 B1 * | 2/2021 | Ding | H05K 1/0274 |
| 2008/0277800 A1 * | 11/2008 | Hwang | H01L 24/97 257/E21.511 |
| 2009/0152715 A1 * | 6/2009 | Shim | H01L 21/76802 257/737 |
| 2010/0225002 A1 * | 9/2010 | Law | H01L 23/481 257/E21.597 |
| 2010/0327439 A1 * | 12/2010 | Hwang | H01L 23/481 257/737 |
| 2011/0266691 A1 * | 11/2011 | Lin | H01L 21/76898 257/E27.111 |
| 2014/0262457 A1 * | 9/2014 | Katkar | H01L 23/5385 174/257 |
| 2016/0260659 A1 * | 9/2016 | Hsieh | H01L 23/49822 |
| 2017/0254968 A1 * | 9/2017 | Ding | H01L 24/20 |
| 2018/0358298 A1 * | 12/2018 | Zhai | H01L 21/4853 |
| 2019/0131267 A1 * | 5/2019 | Wang | H01L 23/49811 |
| 2019/0164936 A1 * | 5/2019 | Agarwal | H01L 25/0657 |
| 2020/0243370 A1 * | 7/2020 | Lin | H01L 23/3128 |
| 2020/0243443 A1 * | 7/2020 | Kuwabara | H01L 23/3107 |
| 2020/0312766 A1 * | 10/2020 | Bhagavat | H01L 21/6836 |
| 2020/0350197 A1 * | 11/2020 | Lin | H01L 25/105 |
| 2021/0028061 A1 * | 1/2021 | Farooq | H01L 25/50 |
| 2021/0138506 A1 * | 5/2021 | Lee | H10N 30/00 |

(Continued)

*Primary Examiner* — Mamadou L Diallo (57) ABSTRACT

A semiconductor package for high-speed die connections using a conductive insert, the semiconductor package comprising: a die; a plurality of redistribution layers; a conductive insert housed in a perforation through the plurality of redistribution layers; and a conductive bump conductively coupled to an input/output (I/O) connection point of the die via the conductive insert.

20 Claims, 11 Drawing Sheets

(56) References Cited

U.S. PATENT DOCUMENTS

| | | | |
|---|---|---|---|
| 2021/0159160 A1* | 5/2021 | Chen | H01L 23/5383 |
| 2021/0202353 A1* | 7/2021 | Jhong | H01L 23/5384 |
| 2022/0029271 A1* | 1/2022 | Cho | H01L 21/4857 |
| 2022/0077096 A1* | 3/2022 | Zhao | H01L 25/50 |
| 2022/0102280 A1* | 3/2022 | Dabral | H01L 25/0655 |
| 2022/0189897 A1 | 6/2022 | Agarwal | |

* cited by examiner

Create A Perforation In A Plurality Of Redistribution Layers Of A Semiconductor Package, Wherein The Perforation Exposes An Input/Output Connection Point Of A Die 502

Insert, Into The Perforation, A Conductive Insert 504

Apply A Conductive Bump To The Semiconductor Package Creating A Conductive Pathway Between The Conductive Bump And The Input/Output Connection Point Of The Die 506

FIG. 5

Create A Perforation In A Plurality Of Redistribution Layers Of A Semiconductor Package, Wherein The Perforation Exposes An Input/Output Connection Point Of A Die 502

Insert, Into The Perforation, A Conductive Insert 504

Apply An Under Bump Metallization Layer To The Semiconductor Package 602

Apply A Conductive Bump To The Semiconductor Package Creating A Conductive Pathway Between The Conductive Bump And The Input/Output Connection Point Of The Die 506

FIG. 6

Create A Perforation In A Plurality Of Redistribution Layers Of A Semiconductor Package, Wherein The Perforation Exposes An Input/Output Connection Point Of A Die 502

Insert, Into The Perforation, A Conductive Insert 504

Apply A Power Delivery Layer On The Plurality Of Fabrication Redistribution Layers 702

Apply A Conductive Bump To The Semiconductor Package Creating A Conductive Pathway Between The Conductive Bump And The Input/Output Connection Point Of The Die 506

FIG. 7

HIGH-SPEED DIE CONNECTIONS USING A CONDUCTIVE INSERT

CROSS-REFERENCE TO RELATED APPLICATIONS

This is a continuation application of and claims priority for patent entitled to a filing date and claiming the benefit of earlier-filed U.S. Pat. No. 11,749,629, issued Sep. 5, 2023. Each patent application cited herein is hereby incorporated by reference in its entirety.

BACKGROUND

Semiconductor packages include solder bumps to allow for connections to be formed with the semiconductor package, such as a controlled collapse chip connection (C4). The solder bumps require a conductive pathway to the input/output connections of a die. Existing solutions implement alternating series of vias and conductive pads in redistribution layers applied to the die. This series of vias and dies results in increased capacitance, series resistance, and inductance.

DETAILED DESCRIPTION

In some embodiments, a semiconductor package for high-speed die connections using a conductive insert includes: a die; a plurality of redistribution layers; a conductive insert housed in a perforation through the plurality of redistribution layers; and a conductive bump conductively coupled to an input/output connection point of the die via the conductive insert.

In some embodiments, the semiconductor package further includes an under bump metallization layer, wherein the conductive bump is applied to the under bump metallization layer. In some embodiments, the input/output connection point of the die includes a conductive pad of the die. In some embodiments, the plurality of redistribution layers include a plurality of back end of line redistribution layers. In some embodiments, the plurality of redistribution layers include a plurality of fabrication redistribution layers. In some embodiments, the semiconductor package further includes a power delivery layer applied to the plurality of fabrication redistribution layers, wherein the conductive bump is applied to the power delivery layer. In some embodiments, the semiconductor package further includes die, wherein the plurality of inorganic fabrication redistribution layers facilitate communication between the die and the other die.

In some embodiments, a method for high-speed die connections using a conductive insert includes: creating a perforation in a plurality of redistribution layers of a semiconductor package, wherein the perforation exposes an input/output connection point of a die; inserting, into the perforation, a conductive insert; and applying a conductive bump to the semiconductor package creating a conductive pathway between the conductive bump and the input/output connection point of the die.

In some embodiments, the method further includes applying an under bump metallization layer to the semiconductor package, and wherein the conductive bump is applied to the under bump metallization layer. In some embodiments, the input/output connection point of the die includes a conductive pad of the die. In some embodiments, the plurality of redistribution layers include a plurality of back end of line redistribution layers. In some embodiments, the plurality of redistribution layers include a plurality of fabrication redistribution layers. In some embodiments, the method further includes applying a power delivery layer on the plurality of fabrication redistribution layers, wherein the conductive bump is applied to the power delivery layer. In some embodiments, the plurality of inorganic fabrication redistribution layers facilitate communication between the die and another die in the semiconductor package.

In some embodiments, an apparatus for high-speed die connections using a conductive insert includes: a component; and a semiconductor package operatively coupled to the component, the semiconductor package including: a die; a plurality of redistribution layers; a conductive insert housed in a perforation through the plurality of redistribution layers; and a conductive bump conductively coupled to an input/output connection point of the die via the conductive insert.

In some embodiments, the semiconductor package further includes an under bump metallization layer, wherein the conductive bump is applied to the under bump metallization layer. In some embodiments, the input/output connection point of the die includes a conductive pad of the die. In some embodiments, the input/output connection point of the die includes a bonding pad of the die. In some embodiments, the plurality of redistribution layers include a plurality of back end of line redistribution layers. In some embodiments, the plurality of redistribution layers include a plurality of fabrication redistribution layers. In some embodiments, the semiconductor package further includes a power delivery layer applied to the plurality of fabrication redistribution layers, wherein the conductive bump is applied to the power delivery layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" may be used herein to more easily identify various components, and may identify that those components are, for example, on opposing sides of another component. The spatially relative terms are intended to encompass different orientations of the device in use or operation in addition to the orientation depicted in the figures.

The construction of a semiconductor device such as a system-in-package (SiP) or system-on-integrated chip (SoIC) generally includes a die fabrication process and a packaging process. The fabrication process, typically performed in a clean room at a foundry, includes fabricating system-on-a-chip (SoC) dies that implement a component, or functional circuit block, of the system on a wafer. For example, each SoC die includes a component such as a processor core, interface, memory, graphical processing unit, digital signal processor, and the like. These components are partitioned on the wafer. During the fabrication process, the device layers implementing the functional circuit blocks and the redistribution structures connecting those functional circuit blocks are created in a clean room with great precision. The wafer is then diced to create individual SoC dies (e.g., "chiplets").

A given die includes various input/output (I/Os) connections. In order to interconnect the die with other components, solder bumps are used as part of a conductive pathway to the I/O connections of the die. For example, in the controlled collapse chip connection (C4) process, solder bumps are deposited on a top side of a semiconductor package, where the semiconductor package has a conductive pathway from an I/O connection of the die to the top side through the semiconductor package. The semiconductor package is coupled to other components (e.g., a chip, a motherboard, and the like) by facing the top side of the semiconductor package to the connection points of the other components, reheating the solder bumps to flow into the connection points of the other components, thereby forming a connection to these other components.

Existing solutions for forming a conductive pathway from the I/O connections of a die to a face of a semiconductor package require the use of a conductive pathway formed by a series of vias and conductive pads. For example, a semiconductor package will include a die with multiple redistribution layers (e.g., back end of line (BEOL) organic redistribution layers) deposited on the die. The top face of the semiconductor package will include a metallization layer of a conductive metal (e.g., copper, gold, or another layer of metal) with solder bumps deposited on the metallization layer. Between the metallization layer and an I/O connection point of the die, such as a conductive pad or plate bonded to the die at an I/O connection, a conductive pathway is formed in the redistribution layers by a series of conductive vias, with a conductive pad separating each via. For example, each redistribution layer will include either a via or a conductive pad that are each in conductive contact with the via or pad of the adjacent layers. Though this use of a series of alternating vias and pads provides a conductive pathway between the solder bumps at the top face of the semiconductor package and the I/O connections of the die, the use of this series of vias and pads provides considerable capacitance, series resistance, and inductance. As the number of redistribution layers increases, requiring more pads and vias, the capacitance, resistance, and inductance also increase.

Figure 1:
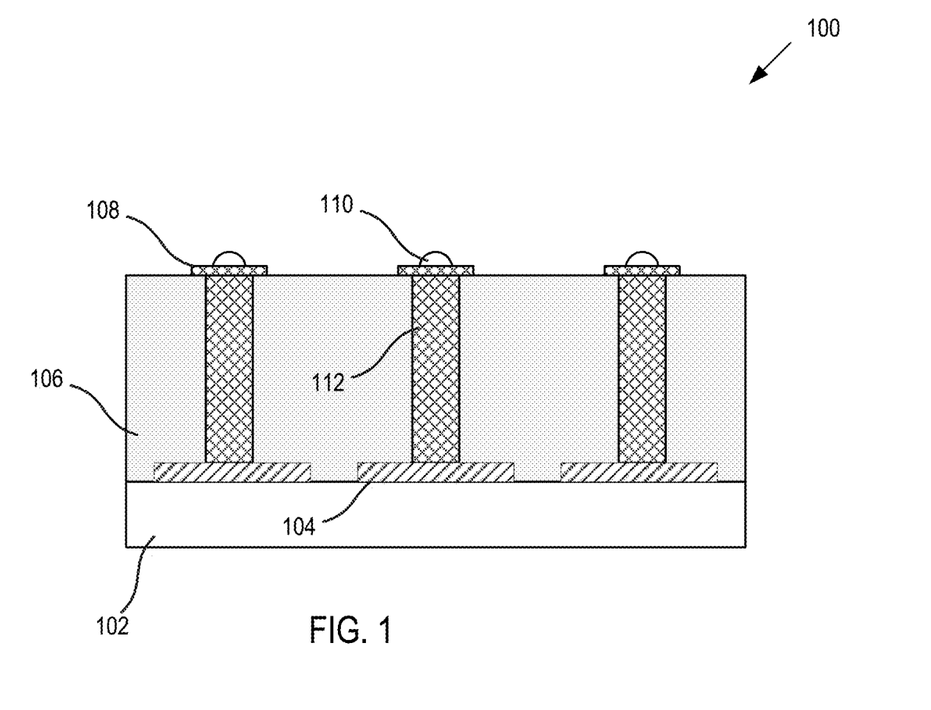
FIG. 1 is a block diagram of an example semiconductor package for high-speed die connections using a conductive insert according to some embodiments.

To address these drawbacks, a semiconductor package 100 for high-speed die connections using a conductive insert is shown in FIG. 1. The semiconductor package 100 of FIG. 1 can be implemented in a variety of devices or apparatuses, including mobile devices, personal computers, peripheral hardware components, gaming devices, set-top boxes, and the like, or any other computing device as can be appreciated. The semiconductor package 100 includes a die 102. The die 102 is composed of a bulk suitable material (e.g., silicon, germanium, or gallium derivatives) and device layers typically fabricated by sequentially depositing insulating or dielectric layers, conductive layers, and semiconductive layers of material over the semiconductor bulk, and patterning the various material layers using photolithography and photomasking to form circuit components and elements (e.g., transistors, capacitors, resistors, etc.). In some embodiments, the circuit components are connected to form integrated circuits that implement a functional circuit block of a SoC die, such as a processor, interface, memory, and or other system component.

The surface of the die 102 includes multiple input/output (I/O) connections allowing for signals to travel to and from the die 102, thereby allowing the die 102 to communicate with other components as desired. Conductive pads 104 are bonded to the surface of the die 102 at these I/O connections to provide a connection point for conductive pathways, such as wires, traces, and the like. For example, the conductive pads 104 are composed of aluminum, copper, gold, or another conductive material as can be appreciated. The conductive pads 104 bonded to the surface of the die 102 are also referred to as I/O pads, in contrast to other conductive pads described above to connect vias within redistribution layers.

The semiconductor package 100 also includes multiple redistribution layers 106 deposited on the die 102. Although the redistribution layers 106 are represented by a continuous blocks of color for clarity, it is understood that the redistribution layers 106 as shown represent multiple layers deposited on top of each other on the die 102. In some embodiments, the redistribution layers 106 include redistribution layers with inorganic passivation or redistribution layers with organic passivation A redistribution layer generally is an extra metal layer on a chip that makes the I/O connections of an integrated circuit available in other locations of the chip for better access to the pads where necessary. Redistribution layers are also used to house connections between the I/O connections of a die. For example, in some embodiments, the redistribution layers 106 house traces (not shown) of conductive material (e.g., copper) to provide connections between various input/output connections of the die 102. For example, these traces are conductively coupled to conductive pads 104 of the die 102, to pins of the die 102 for carrying I/O signals, or otherwise coupling I/O connections of the die 102. In some embodiments, such traces are placed or housed in the redistribution layers 106 in a fan out configuration.

Metallization layers 108 are deposited on the surface of the semiconductor package 100. The metallization layers 108 are layers of a conductive material such as copper, gold, or another conductive metal to provide a conductive surface to which solder bumps 110 are applied. The solder bumps 110 are bumps of a solidified conductive alloy composed of tin, copper, silver, bismuth, indium, zinc, antimony, lead, or other metals. For example, the solder bumps 110 are bumps facilitating a controlled collapse chip connection (C4) connection with the semiconductor package 100.

In contrast to the approaches described above where a series of vias and conductive pads would be housed in the redistribution layers 106 to provide a conductive pathway between the conductive pad 104 bonded to the die 102 and the solder bumps 110 (via the metallization layer 108), the semiconductor package 100 uses conductive inserts 112 to conductively couple the conductive pads 104 to the metallization layer 108 on the surface of the semiconductor package 100. The conductive insert 112 is a continuous (e.g., a single piece of) conductive material such as copper, gold, and the like, that traverses through the redistribution layers 106. For example, the conductive insert 112 is a solid portion of conductive metal, such as a rod or pillar.

To insert the conductive insert 112 into the semiconductor package 100, after application of the redistribution layers 106 but before application of the metallization layers 108, the redistribution layers 106 are perforated to expose the conductive pads 104. In some example, a drill or bore is used to perforate the redistribution layers 106 to create a housing (e.g., a hole) for the conductive inserts 112. In another example, dry or wet etching is used to create the perforations in the redistribution layers 106. The conductive insert 112 is then inserted into the perforations that traverse the redistribution layers, thereby making contact with the conductive pads 104. One skilled in the art will appreciate that the conductive inserts 112 are placed and housed in the perforations with or without a conductive or non-conductive gap-filling material also present in the perforations. One skilled in the art will also appreciate that, in some embodiments, the conductive insert 112 is either formed prior to insertion or trimmed after insertion to be coplanar with a topmost redistribution layer 106 onto which the metallization layer 108 is applied.

After application of the metallization layers 108 and solder bumps 110, a conductive pathway is formed between the solder bumps 110 and the conductive pad 104 via the conductive inserts 112. One skilled in the art will appreciate that the use of a single, continuous portion of a conductive metal provides advantages over the use of multiple pads and vias in capacitance, resistance, and inductance, providing for a superior signal pathway to the die 102.

Figure 2:
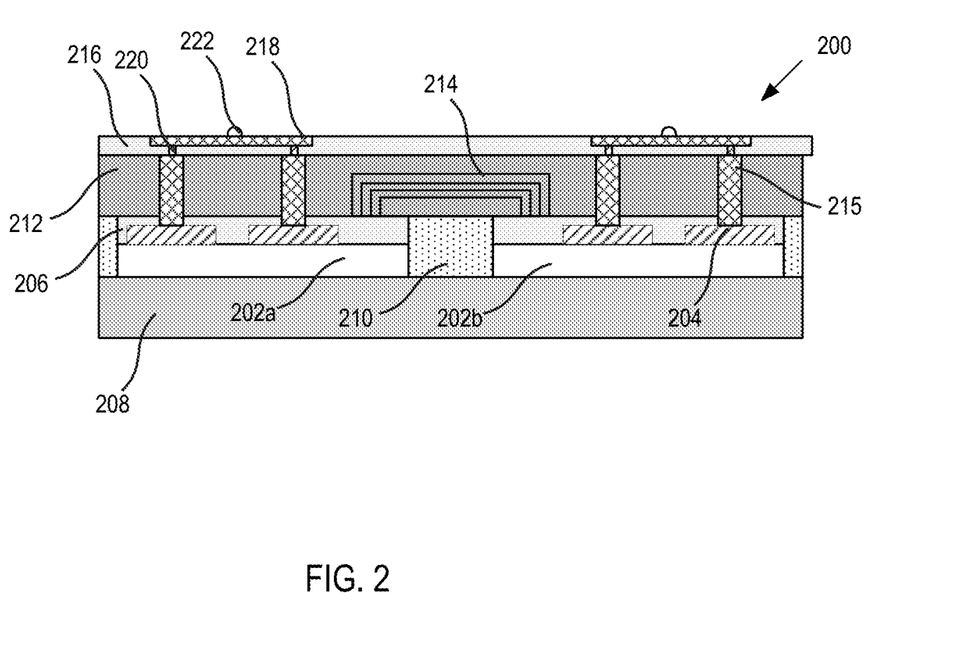
FIG. 2 is a block diagram of an example semiconductor package for high-speed die connections using a conductive insert according to some embodiments.

In some embodiments, high-speed die connections using a conductive insert is used in semiconductor packages that include multiple interconnected dies. For example, as shown in FIG. 2, a semiconductor package 200 includes dies 202a and 202b. The dies 202a and 202b are similar to the die 102 as described in FIG. 1. Each of the dies 202a and 202b include conductive pads 204 and redistribution layers 206 similar to the conductive pads 104 and redistribution layers 106 (e.g., organic or inorganic redistribution layers) of FIG. 1.

FIG. 2 differs from FIG. 1 in that the dies 202a and 202b are deposited on a carrier 208. The carrier 208 provides mechanical support to the semiconductor package 200 structure. In some embodiments, the carrier 208 provides a surface for attaching a thermal dissipation device such as a heat sink. The semiconductor package 200 also includes an encapsulating layer 210 that fills gaps between the dies 202a,b and provides additional structural support for the semiconductor package 200. For example, in some embodiments, the encapsulating layer 210 is an epoxy or another polymer material.

The semiconductor package 200 also includes redistribution layers 212. In contrast to the redistribution layers 206 that are deposited onto a single die 202a,b, the redistribution layers 212 are deposited across both dies 202a,b, by virtue of being deposited on the redistribution layers 206 and encapsulating layer 210. In some embodiments, the redistribution layers 212 are inorganic fabrication redistribution layers (FAB RDLs) of silicon dioxide or another dielectric material. The redistribution layers 212 house traces 214. The traces 214 are traces of conductive material such as copper, gold, and the like that provide a conductive signal pathway between the dies 202a,b. In some embodiments, the traces 214 of a given redistribution layer 212 are each coupled to vias or other conductive components that provide conductive pathways between redistribution layers 212, thus providing for conductive pathways between the dies 202a,b that traverse multiple redistribution layers 212. In some embodiments, the traces 214 are housed in the redistribution layers 212 in a fan out configuration.

The semiconductor package 200 also includes conductive inserts 215. The conductive inserts 215 are inserted into perforations that traverse the redistribution layers 206, 212 and contact the conductive pads 204. As with FIG. 1, the conductive inserts 215 are inserted into perforations created through drilling, boring, dry etching, or other approaches as can be appreciated that serve to expose the conductive pads 204 via the redistribution layers 206, 212.

The semiconductor package 200 also includes a power delivery layer 216. The power delivery layer 216 is a redistribution layer that includes components to provide power to various components of the semiconductor package 200, such as the dies 202a,b. Accordingly, the power delivery layer 216 includes, for example, connections to power sources, grounds, and the like, as well as traces or other conductive pathways to the components of the semiconductor package 200. In this example, the power delivery layer 216 includes metallization layers 218 in conductive contact with the conductive inserts 215 via conductive pillars 220 of copper, gold, or another conductive material. The conductive pillars 220 provide a conductive connection between the metallization layers 218 and conductive inserts 215 where the metallization layers 218 are coplanar with the power delivery layer 216. Solder bumps 222 are deposited on the metallization layers 218 to allow for the semiconductor package 200 to be installed or connected to other components using a C4 connection or another connection. One skilled in the art will appreciate that, in embodiments where a power delivery layer 216 is not required, a metallization layer 218 is applied on the redistribution layers 212 in contact with the conductive inserts 215.

One skilled in the art will appreciate that, in some embodiments, the solder bumps 110, 222 as described in FIGS. 1 and 2 are omitted at the time of manufacture and applied later. For example, the semiconductor packages 100, 200 are manufactured without solder such that wires or other components are able to be soldered or otherwise attached to the metallization layers 108, 218 as needed.

FIGS. 3A-3F depict a fabrication process for a semiconductor package, such as the semiconductor package 100 as described in FIG. 1. Beginning with FIG. 3A, a die 102 is deposited on a carrier 302. The die 102 is composed of a bulk suitable material (e.g., silicon, germanium, or gallium derivatives) and device layers typically fabricated by sequentially depositing insulating or dielectric layers, conductive layers, and semiconductive layers of material over the semiconductor bulk, and patterning the various material layers using photolithography and photomasking to form circuit components and elements (e.g., transistors, capacitors, resistors, etc.). The carrier 302 provides mechanical support for the semiconductor package during manufacture.

Figure 3A:
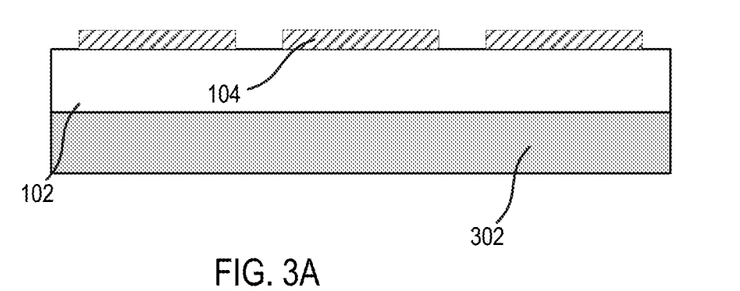
FIGS. 3A-3F show an example fabrication process for a semiconductor package for high-speed die connections using a conductive insert according to some embodiments.

The die 102 includes conductive pads 104 providing for a connection point to the I/O connections of the die 102. The conductive pads 104 are compose of aluminum, gold, copper, or another conductive metal.

Figure 3B:
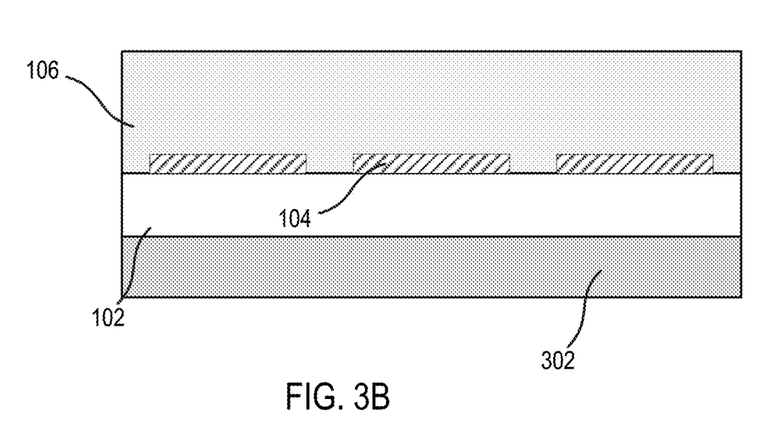

At FIG. 3B, multiple redistribution layers 106 are applied to the semiconductor package. In some embodiments, the redistribution layers 106 provide connections between various I/O connections of the die 102 using conductive traces. In some embodiments, these conductive traces traverse multiple redistribution layers 106. For example, these traces are conductively coupled to conductive pads 104 of the die 102, to pins of the die 102 for carrying I/O signals, or otherwise coupling I/O connections of the die 102. In some embodiments, such traces are placed or housed in the redistribution layers 106 in a fan out configuration. In some embodiments, the redistribution layers 106 include fabrication back end of line (FAB BEOL) redistribution layers composed of an organic material such as polyamide.

Figure 3C:
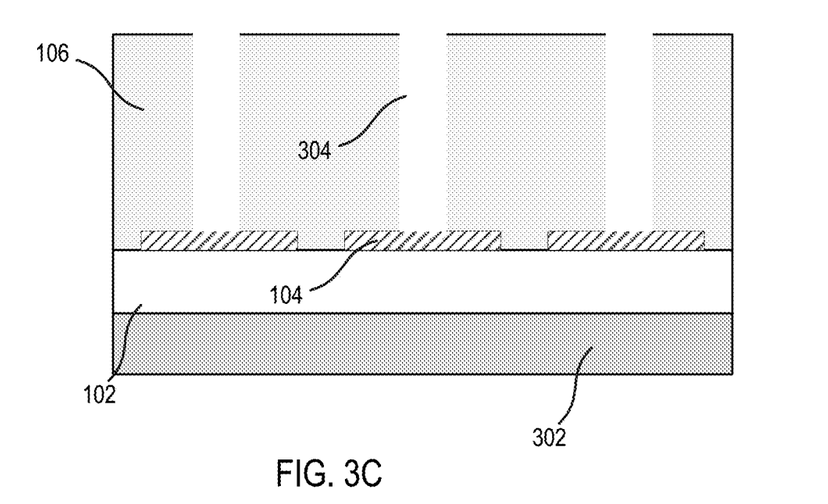

At FIG. 3C, perforations 304 are added to the semiconductor package. The perforations 304 traverse through the redistribution layers 106 and expose the conductive pads 104. The perforations are created using drilling, boring, dry etching, or other approaches as can be appreciated.

Figure 3D:
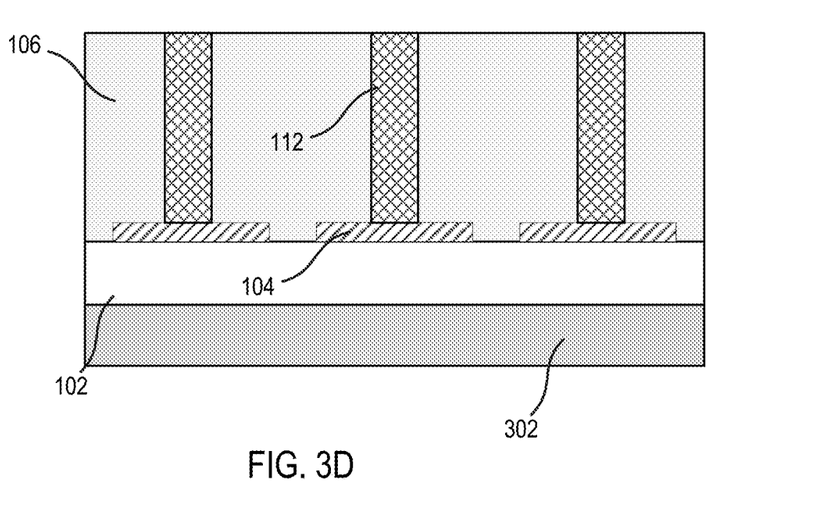

At FIG. 3D, conductive inserts 112 are inserted into the perforations 304. One skilled in the art will appreciate that the conductive inserts 112 are placed and housed in the perforations 304 with or without a conductive or non-conductive gap-filling material also present in the perforations 304. One skilled in the art will also appreciate that, in some embodiments, the conductive insert 112 is either formed prior to insertion or trimmed after insertion to be coplanar with a topmost redistribution layer 106 of the semiconductor package.

Figure 3E:
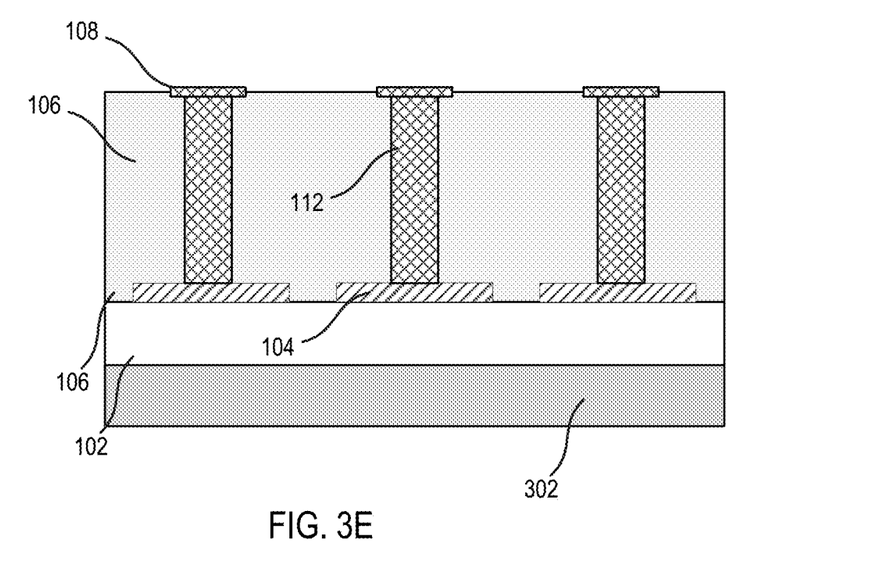
Figure 3F:
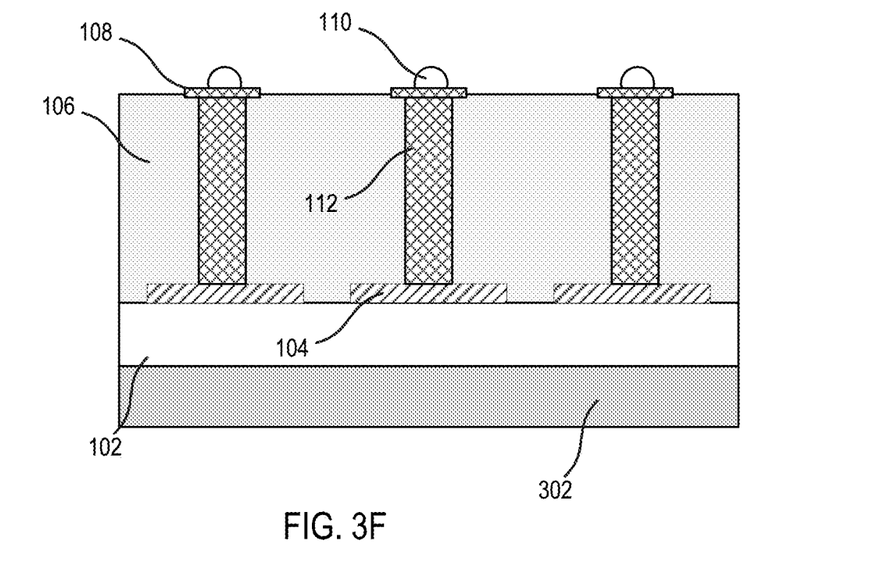

At FIG. 3E, metallization layers 108 are applied to the semiconductor package. The metallization layers 108 are layers of conductive metal such as copper, gold, or another conductive metal. The metallization layers 108 provide a surface for applying solder bumps 110, as shown in FIG. 3F. Thus, a conductive pathway is formed between the conductive pads 104 and the solder bumps 110 via the conductive inserts 112.

FIGS. 4A-4H depict a fabrication process for a semiconductor package, such as the semiconductor package 200 as described in FIG. 2. Beginning with FIG. 4A, dies 202a and 202b are deposited on a carrier 402. The dies 202a,b are similar to the die 102 of FIG. 2 and FIGS. 3A-3F in that the dies 202a,b include conductive pads 204 and redistribution layers 206. For example, the conductive pads 204 providing connection points to the I/O connections of the dies 202a,b. The redistribution layers 206 couple various I/O connections of the die 202a,b using conductive traces. In some embodiments, these conductive traces traverse multiple redistribution layers 206. In some embodiments, the redistribution layers 206 include fabrication back end of line (FAB BEOL) redistribution layers composed of an organic material such as polyamide.

Figure 4A:
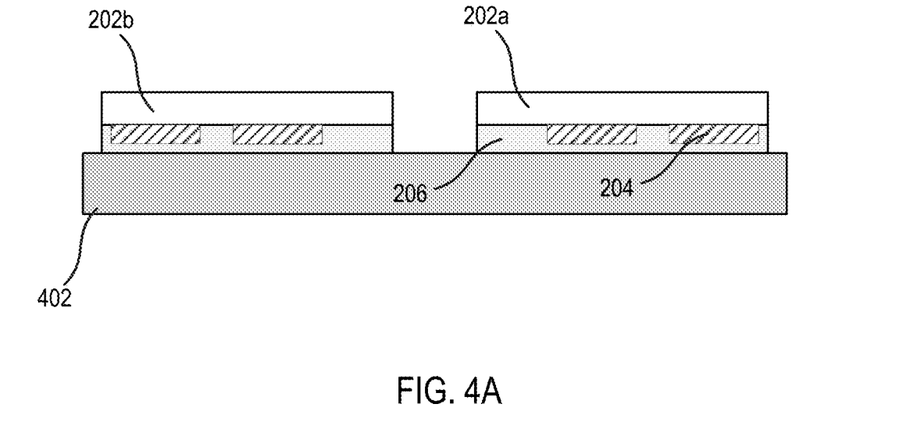
FIGS. 4A-4H show an example fabrication process for a semiconductor package for high-speed die connections using a conductive insert according to some embodiments.
Figure 4B:
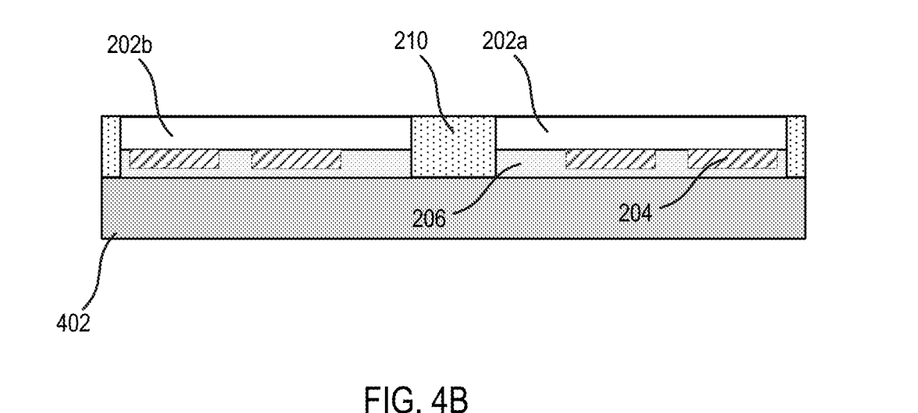

The carrier 402 provides mechanical support for the dies 202a,b. The dies 202a,b are deposited on the carrier 402 such that the redistribution layers 206 contact the carrier 402 in a "face down" configuration. In FIG. 4B, an encapsulating layer 210 is applied to the semiconductor package. The encapsulating layer 210 provides additional structural support for the semiconductor package, and fills any gaps between the dies 202a,b. For example, the encapsulating layer 210 is applied and then portions of the encapsulating layer 210 removed such that the encapsulating layer 210 is coplanar with the dies 202a,b.

Figure 4C:
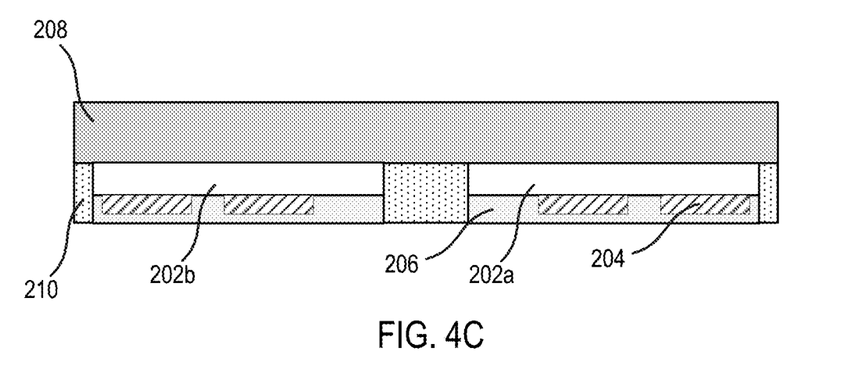
Figure 4D:
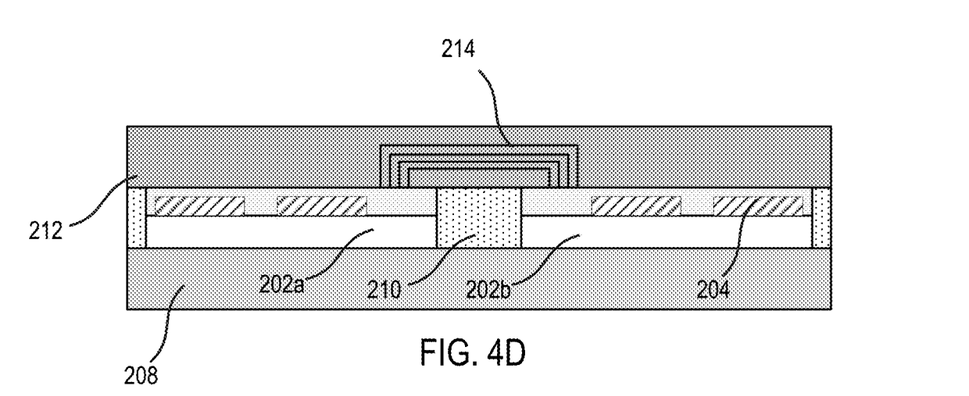

At FIG. 4C, another carrier 208 has been attached to the dies 202a,b, such that the carrier 208 is in contact with the dies 202a,b. The carrier 402 has been removed. At FIG. 4D the view of semiconductor package has been rotated such that the carrier 208 is now shown at the bottom of the semiconductor package. Additionally, redistribution layers 212 have been applied to the semiconductor package. In some embodiments, the redistribution layers 212 are inorganic fabrication redistribution layers (FAB RDLs) of silicon dioxide or another dielectric material. The redistribution layers 212 house traces 214. The traces 214 are traces of conductive material such as copper, gold, and the like that provide a conductive signal pathway between the dies 202a,b. In some embodiments, the traces 214 of a given redistribution layer 212 are each coupled to vias or other conductive components that provide conductive pathways between redistribution layers 212, thus providing for conductive pathways between the dies 202a,b that traverse multiple redistribution layers 212.

Figure 4E:
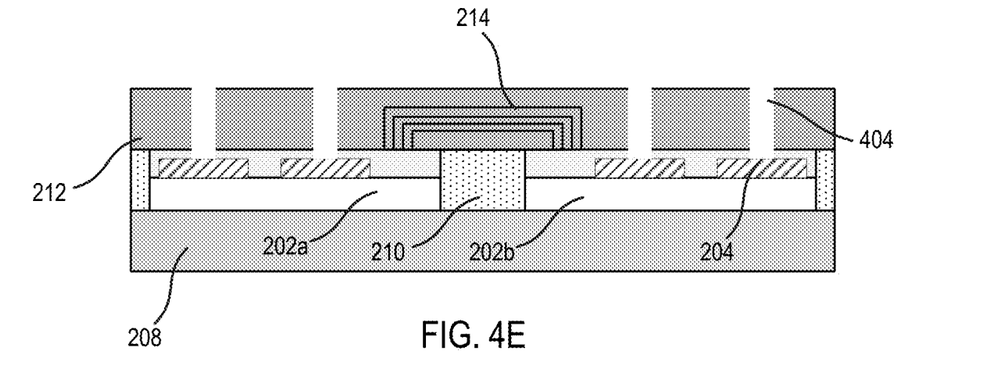

At FIG. 4E, perforations 404 are added to the semiconductor package. The perforations 404 traverse through the redistribution layers 206, 212 and expose the conductive pads 204. The perforations are created using drilling, boring, dry etching, or other approaches as can be appreciated.

Figure 4F:
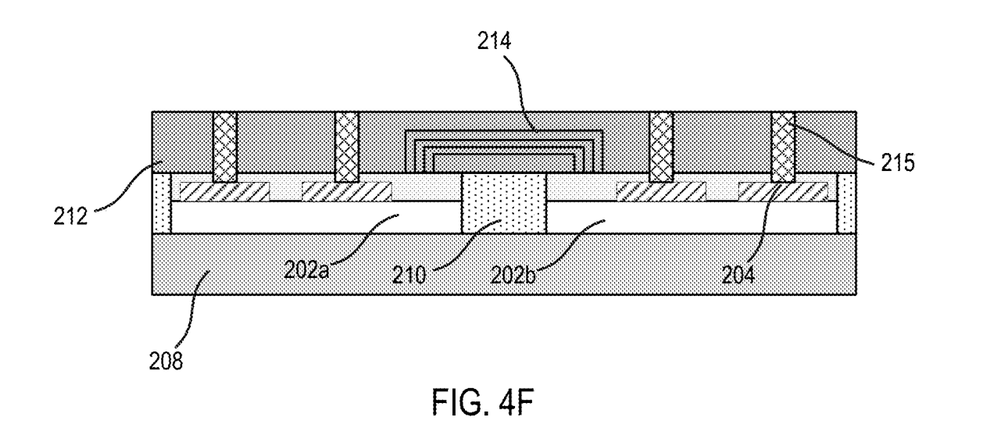

At FIG. 4F, conductive inserts 215 are inserted into the perforations 404. One skilled in the art will appreciate that the conductive inserts 215 are placed and housed in the perforations 404 with or without a conductive or non-conductive gap-filling material also present in the perforations 404. One skilled in the art will also appreciate that, in some embodiments, the conductive insert 215 is either formed prior to insertion or trimmed after insertion to be coplanar with a topmost redistribution layer 212 of the semiconductor package.

Figure 4G:
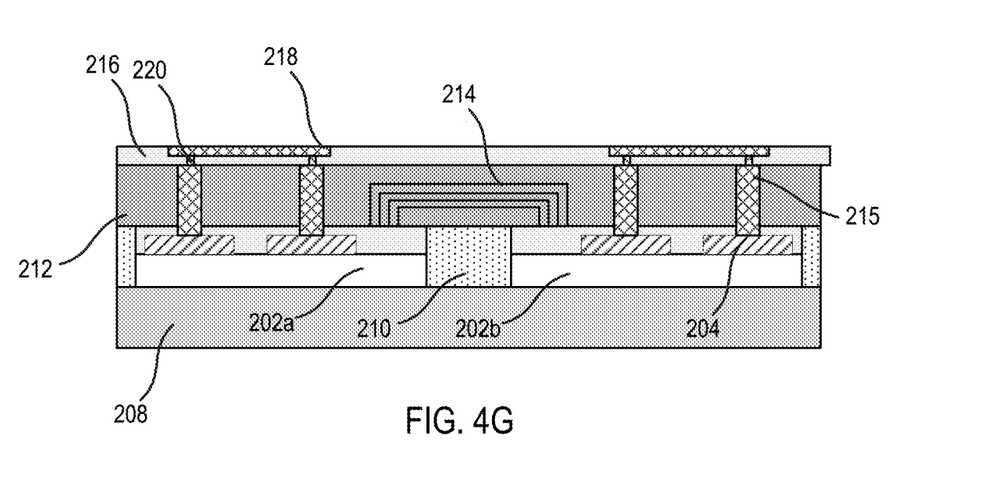
Figure 4H:
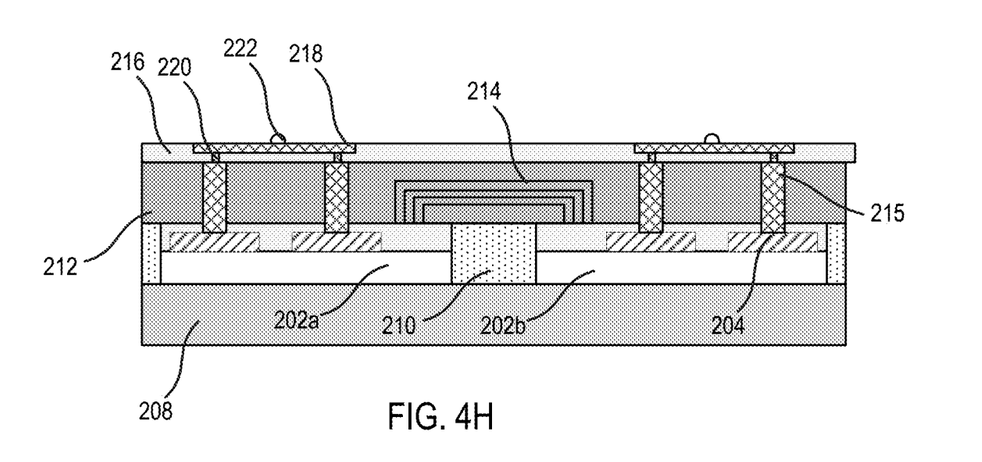

At FIG. 4G, a power delivery layer 216 is applied to the semiconductor package. The power delivery layer 216 is a redistribution layer that includes components to provide power to various components of the semiconductor package, such as the dies 202a,b. Accordingly, the power delivery layer 216 includes, for example, connections to power sources, grounds, and the like, as well as traces or other conductive pathways to the components of the semiconductor package. In this example, the power delivery layer 216 includes metallization layers 218 in conductive contact with the conductive inserts 215 via conductive pillars 220 of copper, gold, or another conductive material. The conductive pillars 220 provide a conductive connection between the metallization layers 218 and conductive inserts 215 where the metallization layers 218 are coplanar with the power delivery layer 216. Solder bumps 222 are deposited on the metallization layers 218 at FIG. 4H to allow for the semiconductor package to be installed or connected to other components using a C4 connection or another connection.

Figure 5:
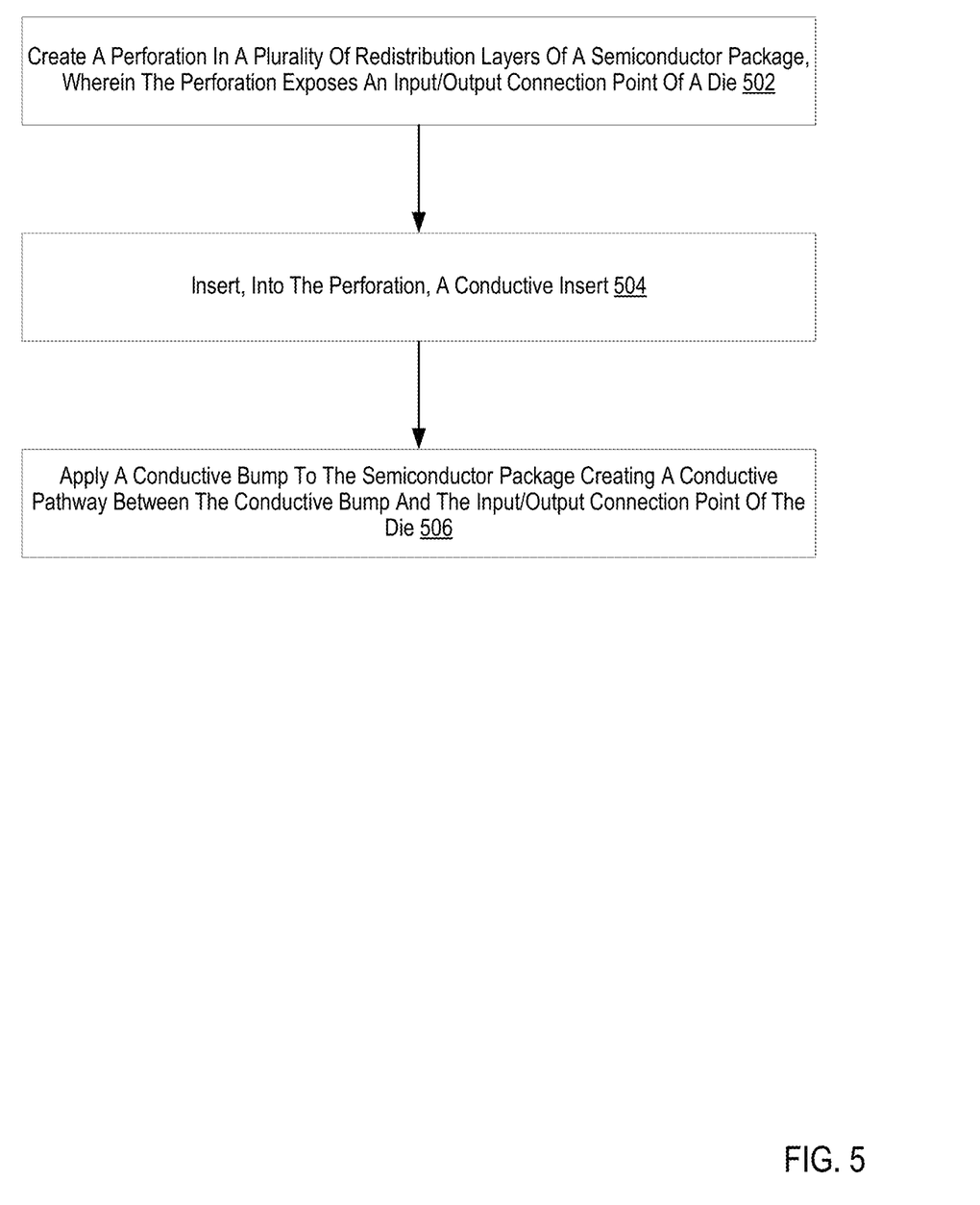
FIG. 5 is a flowchart of an example method for high-speed die connections using a conductive insert according to some embodiments.

For further explanation, FIG. 5 sets forth a flow chart illustrating an exemplary method for high-speed die connections using a conductive insert that includes creating 502 a perforation in a plurality of redistribution layers of a semiconductor package, wherein the perforation exposes an input/output (I/O) connection point of a die. The die is composed of a bulk suitable material (e.g., silicon, germanium, or gallium derivatives) and device layers typically fabricated by sequentially depositing insulating or dielectric layers, conductive layers, and semiconductive layers of material over the semiconductor bulk, and patterning the various material layers using photolithography and photomasking to form circuit components and elements (e.g., transistors, capacitors, resistors, etc.). In some embodiments, the circuit components are connected to form integrated circuits that implement a functional circuit block of a SoC die, such as a processor, interface, memory, and or other system component.

In some embodiments, the redistribution layers include redistribution layers 106 deposited on the die, including fabrication back end of line (FAB BEOL) redistribution layers 106 composed of an organic material such as polyamide. In some embodiments, such redistribution layers 106 house traces of conductive material (e.g., copper) to couple I/O connections of the die. In some embodiments, the die is one of multiple dies and the redistribution layers include redistribution layers 212 deposited across the multiple dies (e.g., over redistribution layers 106 each applied to one of the dies. In some embodiments, the redistribution layers 212 are inorganic fabrication redistribution layers (FAB RDLs) of silicon dioxide or another dielectric material. The redistribution layers 212 house traces 214. The traces 214 are traces of conductive material such as copper, gold, and the like that provide a conductive signal pathway between the dies. In some embodiments, the traces 214 of a given redistribution layer 212 are each coupled to vias or other conductive components that provide conductive pathways between redistribution layers 212, thus providing for conductive pathways between the dies that traverse multiple redistribution layers 212. In some embodiments, the traces 214 are housed in the redistribution layers 212 in a fan out configuration.

In some embodiments, creating 502 the perforation includes drilling, boring, or dry etching through the layers of redistribution layers to expose the I/O connection point of the die. For example, the I/O connection point includes a conductive pad bonded to the surface of the die. For example, the conductive pads 104 composed of aluminum, copper, gold, or another conductive material as can be appreciated.

The method of FIG. 5 also includes inserting 504, into the perforation, a conductive insert. The conductive insert is a continuous (e.g., a single piece) of conductive material such as copper, gold, and the like, that traverses through the perforated redistribution layers. For example, the conductive insert is a solid portion of conductive metal, such as a rod or pillar. The conductive pillar, when inserted to the perforation, contacts the I/O connection point of the die (e.g., the conductive pad). One skilled in the art will appreciate that the conductive inserts are placed and housed in the perforations with or without a conductive or non-conductive gap-filling material also present in the perforations. One skilled in the art will also appreciate that, in some embodiments, the conductive insert is either formed prior to insertion or trimmed after insertion to be coplanar with a topmost perforated redistribution layer.

The method of FIG. 5 also includes applying 506 a conductive bump to the semiconductor package creating a conductive pathway between the conductive bump and the I/O connection point of the die (e.g., via the conductive insert that is inserted into the perforation). The conductive bump includes a solder bump. The solder bump is an alloy composed of tin, copper, silver, bismuth, indium, zinc, antimony, lead, or other metals. For example, the conductive bumps, when applied, facilitate a controlled collapse chip connection (C4) connection with the semiconductor package.

Figure 6:
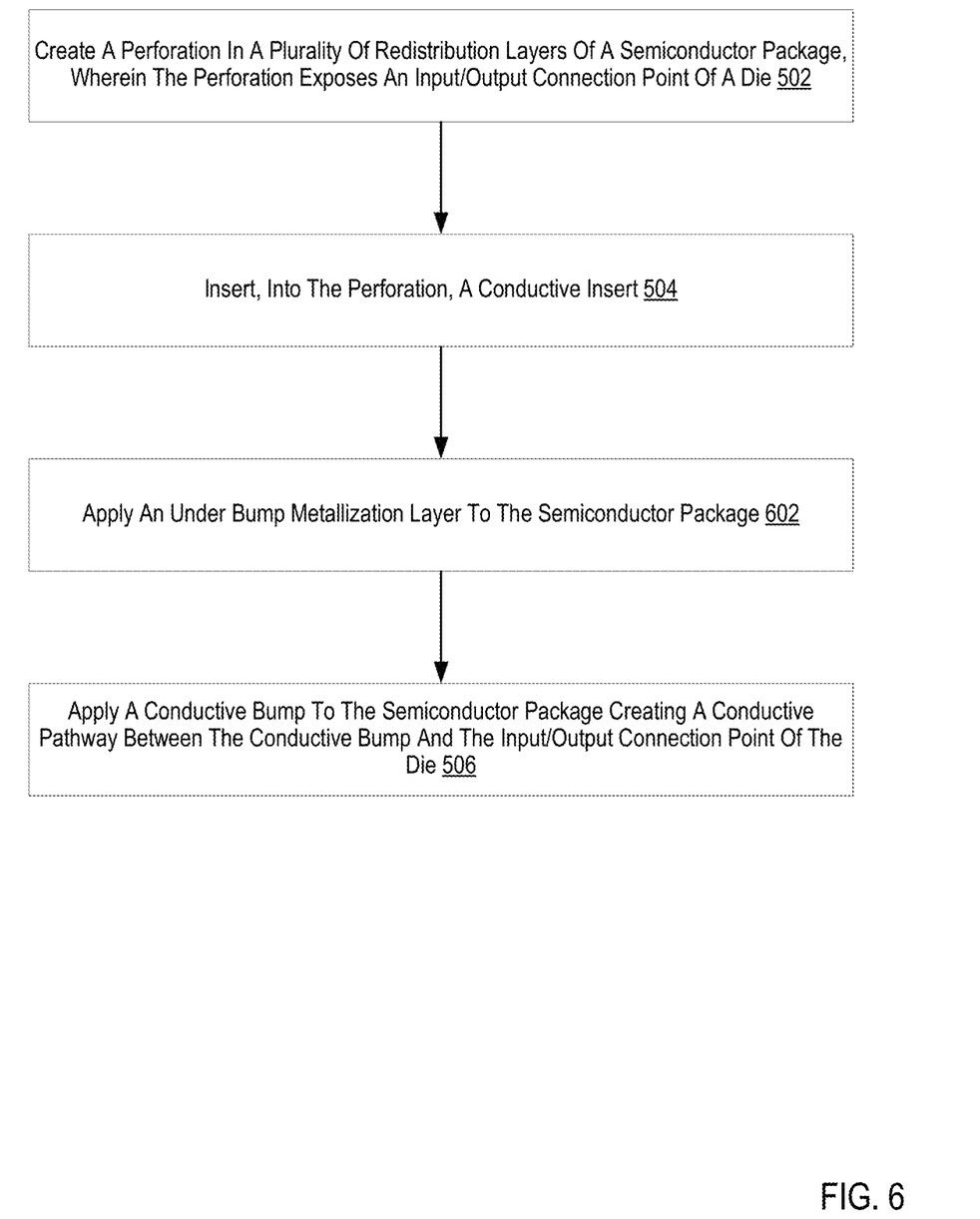
FIG. 6 is a flowchart of an example method for high-speed die connections using a conductive insert according to some embodiments.

For further explanation, FIG. 6 sets forth a flow chart illustrating an exemplary method for high-speed die connections using a conductive insert that includes creating 502 a perforation in a plurality of redistribution layers of a semiconductor package, wherein the perforation exposes an input/output (I/O) connection point of a die; inserting 504, into the perforation, a conductive insert; applying 506 a conductive bump to the semiconductor package creating a conductive pathway between the conductive bump and the I/O connection point of the die.

The method of FIG. 6 differs from FIG. 5 in that the method of FIG. 6 includes applying 602 an under bump metallization layer to the semiconductor package. The metallization layer is a layer of conductive material applied over the conductive inserts and the perforations. For example, the metallization layer includes layers of copper, gold, or another conductive metal. The metallization layer provides a suitable surface onto which the conductive bumps (e.g., solder bumps) are applied.

Figure 7:
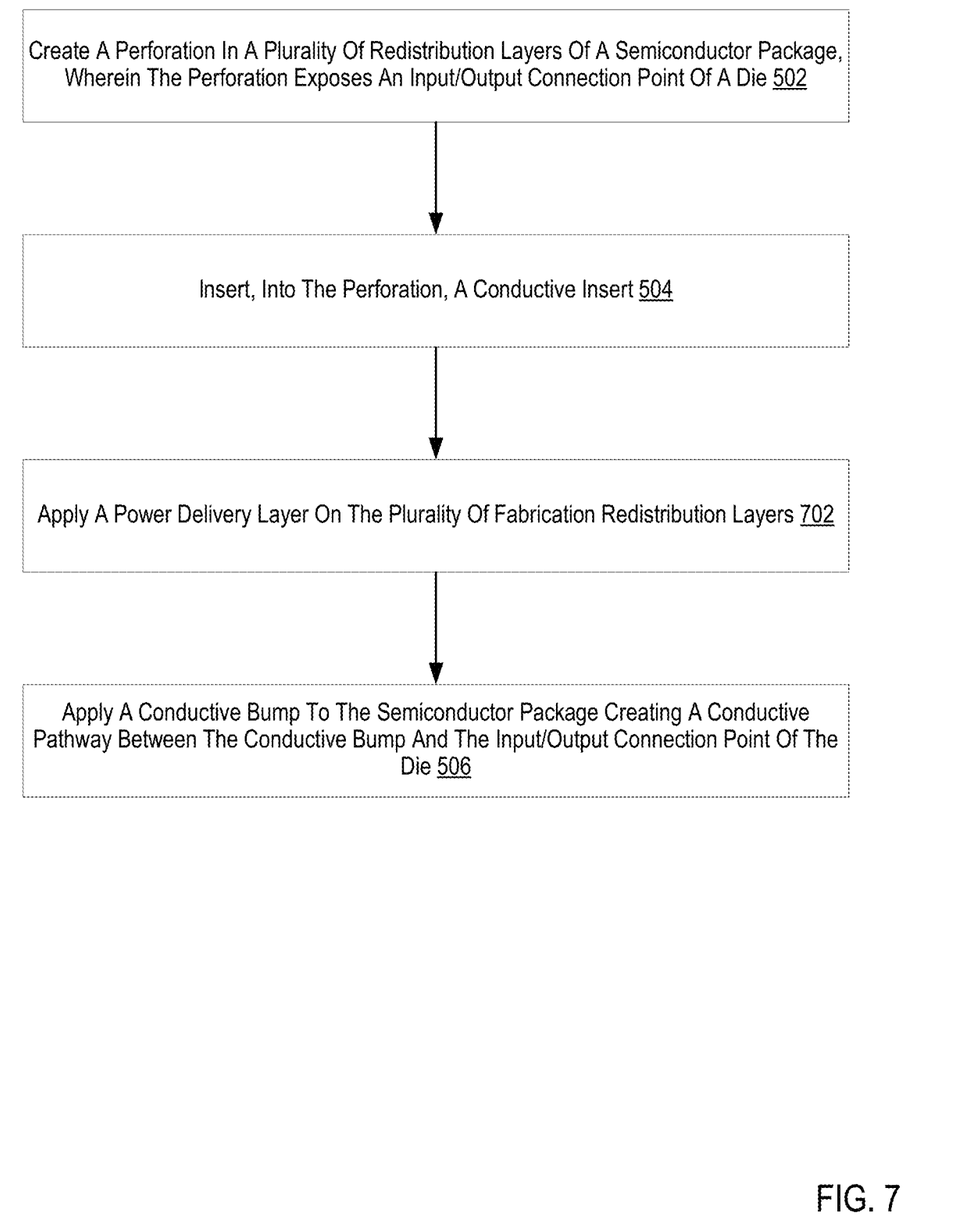
FIG. 7 is a flowchart of an example method for high-speed die connections using a conductive insert according to some embodiments.

For further explanation, FIG. 7 sets forth a flow chart illustrating an exemplary method for high-speed die connections using a conductive insert that includes creating 502 a perforation in a plurality of redistribution layers of a semiconductor package, wherein the perforation exposes an input/output (I/O) connection point of a die; inserting 504, into the perforation, a conductive insert; applying 506 a conductive bump to the semiconductor package creating a conductive pathway between the conductive bump and the I/O connection point of the die.

The method of FIG. 7 differs from FIG. 5 in that the semiconductor package includes a plurality of dies and the perforated redistribution layers include fabrication redistribution layers (FAB RDLs), such as inorganic fabrication redistribution layers. Accordingly, the method of FIG. 7 includes applying 702 a power delivery layer on the plurality of fabrication redistribution layers. The power delivery layer is a redistribution layer that includes components to provide power to various components of the semiconductor package, such as the dies. Accordingly, the power delivery layer includes, for example, connections to power sources, grounds, and the like, as well as traces or other conductive pathways to the components of the semiconductor package. The power delivery layer also includes metallization layers in conductive contact with the conductive inserts to provide a surface for applying the conductive bumps.

In view of the explanations set forth above, readers will recognize that the benefits of high-speed die connections using a conductive insert include:
Improved performance of a computing system by reducing capacitance, series resistance and inductance in conductive pathways from a solder bump to an I/O connection point of a die.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:
1. A semiconductor package for high-speed die connections, the semiconductor package comprising:
a die;
a plurality of redistribution layers;
a first conductive insert and a second conductive insert each housed in a perforation through the plurality of redistribution layers;
a first input/output connection point of the die conductively coupled to a conductive bump via the first conductive insert; and a second input/output connection point of the die conductively coupled to the conductive bump via the second conductive insert.

2. The semiconductor package of claim 1, further comprising an under bump metallization layer, wherein the conductive bump is applied to the under bump metallization layer.

3. The semiconductor package of claim 1, wherein each of the first input/output connection point of the die and the second input/output connection point of the die comprises a conductive pad of the die.

4. The semiconductor package of claim 1, wherein the plurality of redistribution layers comprise a plurality of back end of line redistribution layers.

5. The semiconductor package of claim 1, wherein the plurality of redistribution layers comprise a plurality of fabrication redistribution layers.

6. The semiconductor package of claim 5, further comprising a power delivery layer applied to the plurality of fabrication redistribution layers, wherein the conductive bump is applied to the power delivery layer.

7. The semiconductor package of claim 5, further comprising a second die, wherein the plurality of fabrication redistribution layers facilitate communication between the die and the second die.

8. A method comprising:
creating a first perforation and a second perforation in a plurality of redistribution layers of a semiconductor package, wherein the first perforation exposes a first input/output connection point of a die and the second perforation exposes a second input/output connection point of the die;
inserting a first conductive insert into the first perforation;
inserting a second conductive insert into the second perforation; and
applying a conductive bump to the semiconductor package creating a conductive pathway between the conductive bump and each of the first input/output connection point of the die and the second input/output connection point of the die.

9. The method of claim 8, further comprising applying an under bump metallization layer to the semiconductor package, and wherein the conductive bump is applied to the under bump metallization layer.

10. The method of claim 8, wherein each of the first input/output connection point of the die and the second input/output connection point of the die comprises a conductive pad of the die.

11. The method of claim 8, wherein the plurality of redistribution layers comprise a plurality of back end of line redistribution layers.

12. The method of claim 8, wherein the plurality of redistribution layers comprise a plurality of fabrication redistribution layers.

13. The method of claim 12, further comprising applying a power delivery layer on the plurality of fabrication redistribution layers, wherein the conductive bump is applied to the power delivery layer.

14. The method of claim 12, wherein the plurality of fabrication redistribution layers facilitate communication between the die and a second die in the semiconductor package.

15. An apparatus for high-speed die connections, the apparatus comprising:
a component; and
a semiconductor package operatively coupled to the component, the semiconductor package comprising:
a die;
a plurality of redistribution layers;
a first conductive insert and a second conductive insert each housed in a perforation through the plurality of redistribution layers;
a first input/output connection point of the die conductively coupled to a conductive bump via the first conductive insert; and
a second input/output connection point of the die conductively coupled to the conductive bump via the second conductive insert.

16. The apparatus of claim 15, wherein the semiconductor package further comprises an under bump metallization layer, wherein the conductive bump is applied to the under bump metallization layer.

17. The apparatus of claim 15, wherein each of the first input/output connection point of the die and the second input/output connection point of the die comprises a conductive pad of the die.

18. The apparatus of claim 15, wherein the plurality of redistribution layers comprise a plurality of back end of line redistribution layers.

19. The apparatus of claim 15, wherein the plurality of redistribution layers comprise a plurality of fabrication redistribution layers.

20. The apparatus of claim 19, wherein the semiconductor package further comprises a power delivery layer applied to the plurality of fabrication redistribution layers, wherein the conductive bump is applied to the power delivery layer.

* * * * *